(12) United States Patent
Bhagwat

(10) Patent No.: US 10,333,742 B1
(45) Date of Patent: *Jun. 25, 2019

(54) TERMINATION FOR WIRE PAIR CARRYING DC AND DIFFERENTIAL SIGNALS USING ISOLATION TRANSFORMER WITH SPLIT PRIMARY AND SECONDARY WINDINGS

(71) Applicant: Linear Technology Holding LLC, Norwood, MA (US)

(72) Inventor: Gitesh Bhagwat, Santa Barbara, CA (US)

(73) Assignee: Linear Technology Holding LLC, Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/148,698

(22) Filed: Oct. 1, 2018

Related U.S. Application Data

(63) Continuation-in-part of application No. 16/126,843, filed on Sep. 10, 2018, which is a continuation-in-part of application No. 16/016,301, filed on Jun. 22, 2018.

(60) Provisional application No. 62/643,390, filed on Mar. 15, 2018.

(51) Int. Cl.
*H04L 25/02* (2006.01)
*H03H 7/42* (2006.01)
*H04L 12/40* (2006.01)

(52) U.S. Cl.
CPC ......... *H04L 25/0276* (2013.01); *H03H 7/427* (2013.01); *H04L 12/40045* (2013.01); *H04L 25/026* (2013.01); *H04L 25/0298* (2013.01)

(58) Field of Classification Search
CPC ............. H04L 25/0276; H04L 25/0298; H04L 25/026; H04L 12/40045; H04L 12/10; H03H 7/427; H02M 1/126; H02M 2001/123; H04B 3/548
USPC .................................................. 375/258, 219
See application file for complete search history.

(56) References Cited

U.S. PATENT DOCUMENTS

| | | | | |
|---|---|---|---|---|
| 5,402,485 | A * | 3/1995 | Takato | H04M 3/005 379/345 |
| 6,492,880 | B1 * | 12/2002 | Chiappe | H04L 25/0266 333/22 R |
| 7,924,579 | B2 * | 4/2011 | Arduini | H02M 3/335 363/21.06 |
| 10,148,447 | B1 * | 12/2018 | Rajagopal | H04L 12/10 |

(Continued)

*Primary Examiner* — Juan A Torres
(74) *Attorney, Agent, or Firm* — Patent Law Group LLP; Brian D. Ogonowsky

(57) ABSTRACT

A PHY is coupled across split primary windings of an isolation transformer for differential data transmission and reception between PHYs and for DC isolation. Positive and negative low impedance terminals of a DC power supply are coupled to first and second secondary windings of the transformer as split center taps of the transformer. Respective ends of the wires in the wire pair are coupled to the other ends of the secondary windings. Therefore, the power supply conducts DC current through the secondary windings, while the differential data signals also flow through the secondary windings, generating corresponding differential data signals at the inputs to the PHY. The transformer also attenuates common mode noise. Therefore, the circuit makes multi-use of the isolation transformer, allowing fewer components to be used for the DC coupling, wire termination, and common mode noise cancellation.

20 Claims, 10 Drawing Sheets

(56) References Cited

U.S. PATENT DOCUMENTS

| | | | |
|---|---|---|---|
| 2005/0057276 A1* | 3/2005 | Washburn | H04L 25/0298 326/30 |
| 2008/0062600 A1* | 3/2008 | Crawley | H04L 25/0276 361/56 |
| 2015/0145324 A1* | 5/2015 | Heath | H04B 3/56 307/1 |
| 2015/0295735 A1* | 10/2015 | Gardner | H04L 25/0274 307/1 |
| 2015/0333935 A1* | 11/2015 | Gardner | H04L 25/0266 307/1 |
| 2016/0054777 A1* | 2/2016 | Dwelley | G06F 1/3206 710/110 |
| 2016/0142217 A1* | 5/2016 | Gardner | G01R 31/024 307/1 |
| 2016/0156173 A1* | 6/2016 | Gardner | H02H 3/202 361/91.5 |
| 2016/0308683 A1* | 10/2016 | Pischl | H04L 12/10 |
| 2016/0337138 A1* | 11/2016 | Gardner | H04L 12/10 |
| 2017/0187472 A1 | 6/2017 | Chini et al. | |
| 2018/0024620 A1* | 1/2018 | Gardner | H04L 12/10 713/323 |
| 2018/0026525 A1 | 1/2018 | Gardner | |
| 2018/0254931 A1* | 9/2018 | Gardner | H04B 3/30 |

* cited by examiner

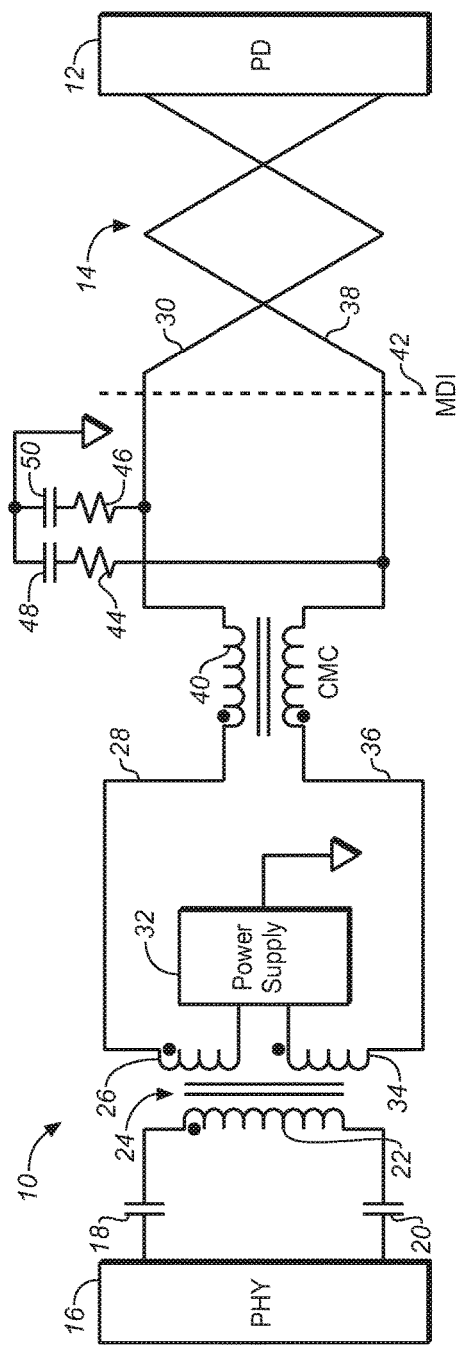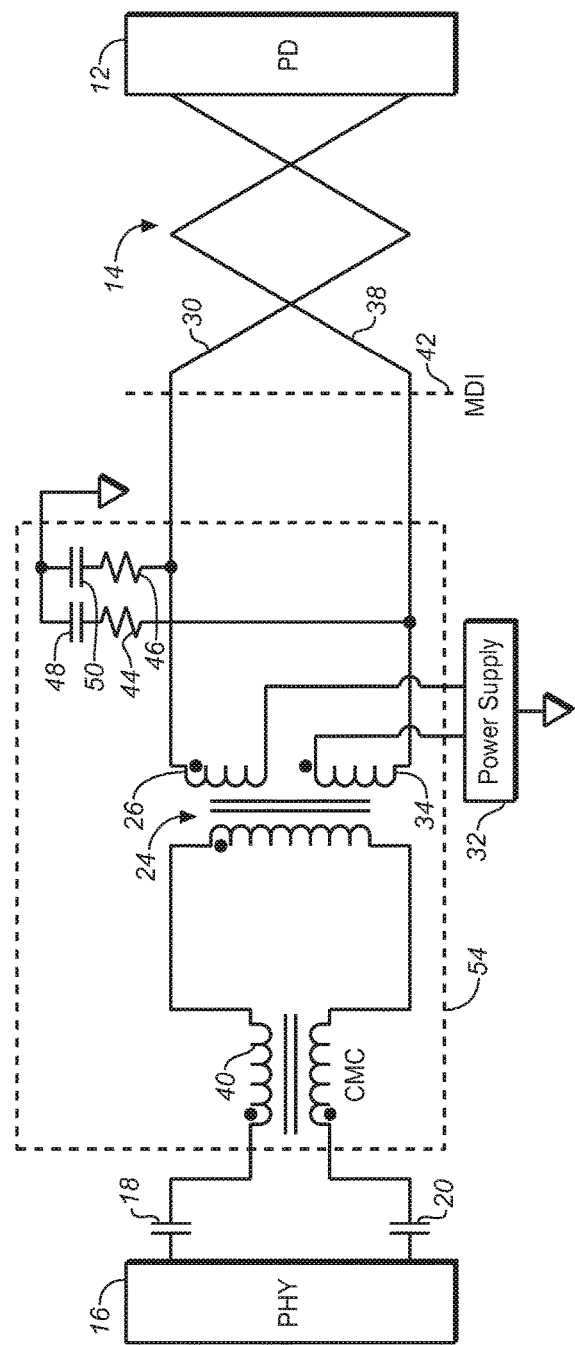

TERMINATION FOR WIRE PAIR CARRYING DC AND DIFFERENTIAL SIGNALS USING ISOLATION TRANSFORMER WITH SPLIT PRIMARY AND SECONDARY WINDINGS

CROSS-REFERENCE TO RELATED APPLICATIONS

This application is a continuation-in-part of U.S. application Ser. No. 16/126,843, filed Sep. 10, 2018, which is based on and claims priority from Ser. No. 16/016,301, filed Jun. 22, 2018, which is based on and claims priority from U.S. Provisional Patent Application Ser. No. 62/643,390, filed Mar. 15, 2018, by Gitesh Bhagwat, incorporated herein by reference.

FIELD OF THE INVENTION

This invention relates to communication systems conducting differential data and DC power over a twisted wire pair and, in particular, to a technique using a center tap isolation transformer for coupling DC power to the wire pair.

BACKGROUND

Many ways have been disclosed for coupling DC power and differential signals to a twisted wire pair. The DC power is used to power equipment connected to the other end of the wire pair, while the differential data allows the equipment at both ends of the wire pair to communicate with each other. Such a system is sometimes referred to as a Power over Data Lines (PoDL) system.

The various termination components should present a low differential data insertion loss, a high common mode noise insertion loss, and a high differential mode return loss (incident power/reflected power). US Publication 2018/0026525, assigned to the present assignee, describes various termination techniques and can provide more background information. FIG. 1 is reproduced from US Publication 2018/0026525.

In FIG. 1, a media dependent interface (MDI) connector 160 is coupled to a twisted wire pair (not shown) carrying both differential data and a DC voltage. The coupling for both ends of the PoDL system may be identical, except that the Powered Device side does not have its own power supply.

A PHY 150 outputs differential data and receives differential data via the MDI connector 160, a common mode choke (CMC) 210, and AC coupling capacitors C1 and C2. The CMC 210 attenuates common mode RF noise from the wire pair. PHY 150 represents the physical layer in the OSI model and is a transceiver that typically includes signal conditioning and decoding circuitry for presenting bits to the next stage. The term PHY is a term of art and is defined by various IEEE standards, depending on the particular application. The PHY is typically an integrated circuit. A digital processor (not shown) is coupled to the PHY 150 for processing the data.

Since the circuit of FIG. 1 is on the Power Sourcing Equipment (PSE) side, DC voltage from a power source 140 is coupled to the wires by separate inductors 142. The inductors 142 block AC and pass DC.

The wires from the MDI connector 160 are terminated by resistors R1 and R2 and capacitors C3 and C4 to minimize reflections.

In a PoDL system, the PHY must be protected from the DC power. Further, common mode RF noise coupled to the wire pair must be attenuated so as not to interfere with the detection of the differential data. It is sometimes desirable to provide DC isolation of the PHY using a transformer to protect the PHY against DC shorts and other conditions, but this adds an additional component and increases size and cost. It is desirable to provide such features without undue loading that would adversely affect the signal integrity of the differential data. It is also desirable to minimize the component count for cost and size.

What is needed is an improved termination circuit in a PoDL system employing DC isolation of the PHY using a transformer, where the circuit has a low-component count for reducing size and cost, low loading on the PHY, low differential data insertion loss, high common mode noise insertion loss, and high differential mode return loss.

SUMMARY

Various improved termination techniques for a PoDL system are described.

In one embodiment, the PHY is AC-coupled to the wire pair. A primary (PHY side) winding of an isolation transformer is coupled to the PHY for the transmission and reception of differential data.

A positive terminal of a DC power supply is coupled to one end of a first secondary (line side) winding, and the other end of the first secondary winding is coupled to one of the wires in the wire pair.

A negative terminal of the DC power supply is coupled to one end of a second secondary (line side) winding and the other end of this second secondary winding is coupled to other one of the wires in the wire pair. The power supply is thus connected such that DC current is injected on one wire and returned on the other wire to power equipment connected to the other end of the wire pair. This can be considered a split center tap of the secondary windings.

Therefore, the power supply conducts DC current through the secondary windings, while the differential data signals also flow through the secondary windings, generating a corresponding differential data signal at the inputs to the PHY. Conversely, transmission from the PHY causes the AC current through the primary winding to generate a differential voltage in the secondary windings that is transmitted by the wire pair.

The power supply provides a low impedance between its positive and negative terminals so there is low differential mode impedance between the split center tap connections of the transformer.

A common mode choke (CMC) is connected in series between the wires in the wire pair and the secondary windings to attenuate common mode RF noise on the wire pair. In another embodiment, the CMC is located between the primary winding of the isolation transformer and the PHY. In another embodiment, the CMC is eliminated if the isolation transformer adequately attenuates common mode RF noise.

An RC termination circuit is also coupled between the wire pair and ground for attenuating noise and providing a suitable termination impedance to minimize reflections.

The disclosed circuits make multi-use of the isolation transformer by providing DC coupling to the wire pair while the power supply provides a low impedance between its terminals for efficiently conducting the differential signals through the respective secondary windings, and while shunting common mode signals at the secondary terminals of the transformer. Thus, the CMC may be optional. As a result, there is a low component count while there is low loading on the PHY, low differential data insertion loss, high common mode noise insertion loss, and high differential mode return loss.

The DC power supply is part of the Power Sourcing Equipment (PSE) side the PoDL system. The other end of the wire pair is coupled to a Powered Device (PD), which may also include a CMC, RC termination, and an isolation transformer. The secondary windings of the PD isolation transformer may have ends coupled between the differential signals and ground, or coupled to ground via a low impedance path in a PD load, since no power supply is used in the PD.

In other embodiments, the primary winding of the isolation transformer is also split, with one split primary winding generating or receiving one differential signal for/from the PHY, and the other split primary winding generating or receiving the other differential signal for/from the PHY. By using both a split primary winding and a split secondary winding, there is symmetry and possible ease of winding, as well as the ability to use the split in the primary windings for various termination schemes. The two primary windings can also be coupled together and to a reference in various schemes. This offers several benefits such as additional DC-isolation of the PHY and reduced common mode (CM) reflections, amongst others.

BRIEF DESCRIPTION OF THE DRAWINGS

FIG. 2 illustrates a first embodiment of a PSE in a PoDL system using an isolation transformer to DC-couple a power supply to the wire pair, provide a low impedance-to-ground termination of secondary windings coupled to conduct the differential signals, and also attenuate common mode noise signals.

FIG. 3 is a first variation of FIG. 2 where the CMC has been moved to the PHY side of the transformer so as to not carry DC current

DETAILED DESCRIPTION

Figure 1:
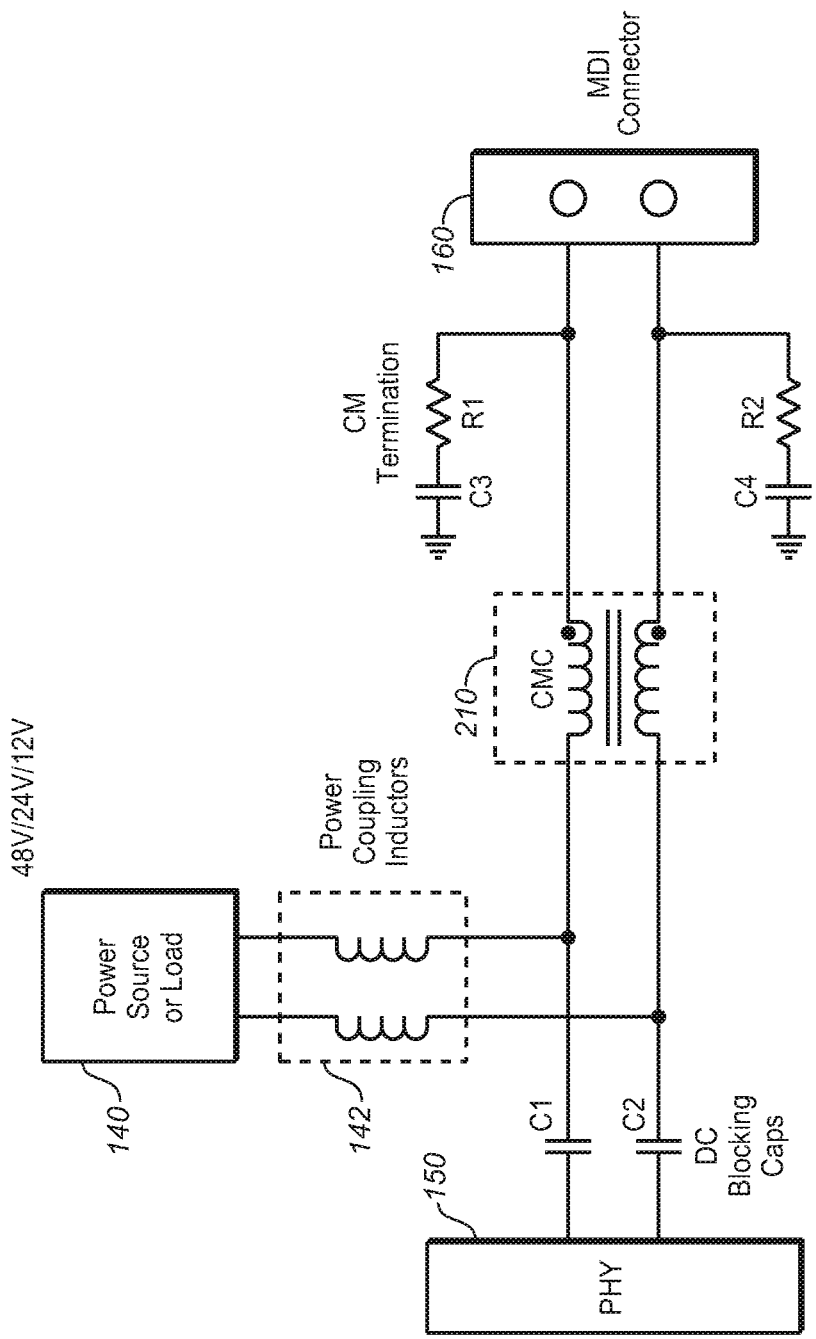
FIG. 1 illustrates a prior art PoDL system.

Five embodiments of a termination circuit in a PSE are described which DC-isolate the PHY from the remainder of the system, DC-couple a power supply to a wire pair, attenuate RF common mode noise on the wire pair, and provide excellent insertion and return losses, while having a low component count.

In FIG. 2, Power Sourcing Equipment (PSE) 10 supplies DC power to a Powered Device (PD) 12 via a twisted wire pair 14. The PHYs in PSE 10 and in PD 12 also communicate using differential data, such as Ethernet data.

A PHY 16 in the PSE 10 represents the physical layer in the OSI model and comprises a transceiver that typically includes signal conditioning and decoding circuitry for presenting bits to the next stage. The term PHY is a term of art and is defined by various IEEE standards, depending on the particular application. The PHY 16 is typically an integrated circuit. A digital processor (not shown) is coupled to the PHY 16 for processing the data.

AC-coupling capacitors 18 and 20, at the input/output ports of the PHY 16, do not attenuate the differential data but block DC.

The other ends of the capacitors 18 and 20 are coupled across a primary winding 22 of an isolation transformer 24. A first secondary winding 26 has one end coupled to a conductor 28 which receives and transmits data signals via the wire 30 in the wire pair 14. The other end of the first secondary winding 26 is coupled to a positive voltage terminal of the DC power supply 32. The power supply 32 has a low impedance between its positive and negative terminals so there is a high differential mode return loss and a low differential mode insertion loss.

A second secondary winding 34 has one end coupled to a conductor 36 which receives and transmits data signals via the wire 38 in the wire pair 14. The other end of the second secondary winding 34 is coupled to a negative voltage terminal of the DC power supply 32. The positive and negative outputs of the DC power supply 32 are just relative terms, and the negative voltage may be a system ground.

Note the relative polarities of the various windings by the dot positions. The dots are on opposite ends of the two secondary windings, causing common mode noise on the wires 28 and 36 to be attenuated while not attenuating differential data signals.

Thus, a differential data signal on the wire pair 14 causes respective currents to flow through the secondary windings 26 and 34 to induce a differential voltage across the primary winding 22 for detection by the PHY 16. The opposite occurs when the PHY 16 transmits differential data.

A common mode choke (CMC) 40 is connected in series between the secondary windings 26 and 34 and the wire pair 14. The CMC 40 is a magnetic device comprising two well-coupled windings in series with the twisted wire pair 14. As shown by the dots on the CMC windings, the windings have the same polarity, so the magnetic field generated by a differential mode signal is substantially cancelled out. Thus, the CMC 40 presents little inductance or impedance to differential mode currents. Common mode currents, however, see a high impedance due to the combined inductance of the windings. The CMC 40 ideally eliminates or greatly attenuates common mode RF noise while providing no loss for the differential or DC voltage signals. However, since the transformer 24 also attenuates common mode noise, the CMC 40 may be optional in low noise environments.

A media dependent interface (MDI) connector 42 is coupled to the wire pair 14. The wires from the MDI connector 42 are terminated by resistors 44 and 46 and capacitors 48 and 50 to minimize reflections.

It is common in a PoDL system for a DC power supply to be coupled to the wire pair via a series-connected differential mode choke (DMC). A DMC has windings with opposite polarities (dots on opposite ends) and attenuates differential signals while not attenuating common mode signals or DC power. Such a DMC is not used in the present invention since the isolation transformer 24 is used to couple the DC power supply 32 to the wire pair 14, as well as conduct the differential data signals. Thus, the isolation transformer 24 provides a DC isolation function for the PHY 16 while conducting the AC differential data signals, while also providing the DC coupling function for the power supply 32. Further, as shown later, the isolation transformer 24 may obviate the need for the CMC 40.

The PD 12 may be coupled to the wire pair 14 with a similar termination system, but the ends of the secondary windings in the PD isolation transformer may be directly coupled to a PD load with a low impedance to system ground. Alternatively, the ends of the secondary windings may be coupled to ground, and the PD load receives DC power from the wire pair 14 via DC-coupling inductors. The PD 12 is powered by the DC power from the power supply 32.

Some benefits of the circuit of FIG. 2 include:
1. The configuration effectively causes the isolation transformer to include a differential mode choke (DMC) function (to DC-couple the power supply to the wire pair), thus reducing component count for PoDL applications requiring transformer isolation for the PHY.
2. The transformer configuration provides a low impedance shunt effect for common mode noise signals (obviating the need for a CMC) thus reducing component count and offering better component utilization.
3. The common mode shunt effect reduces the common mode insertion loss requirement of the CMC which, in turn, reduces the open circuit inductance (OCL) requirement.
4. By eliminating the differential mode load of a separate DMC on the PHY, a transformer with the minimum OCL can be used. This relaxes the turns and core size requirements of the transformer.
5. The transformer also offers a high common mode insertion loss which works in conjunction with the common mode shunt of the secondary windings and the common mode insertion loss of the CMC to further reduce the requirements of the CMC.
6. With a large enough common mode insertion loss of the transformer (by reducing parasitics such as interwinding capacitance between primary and secondary windings), the in-line CMC can be eliminated (as shown in FIG. 4).

Other benefits exist.

FIG. 3 is similar to FIG. 2 except that the CMC 40 is moved to the PHY side of the transformer 24. All the termination components within the box 54 may be integrated in the same package with the MDI connector 42 to minimize the component count, size, and cost. This applies as well to the components in FIG. 2.

Figure 4:
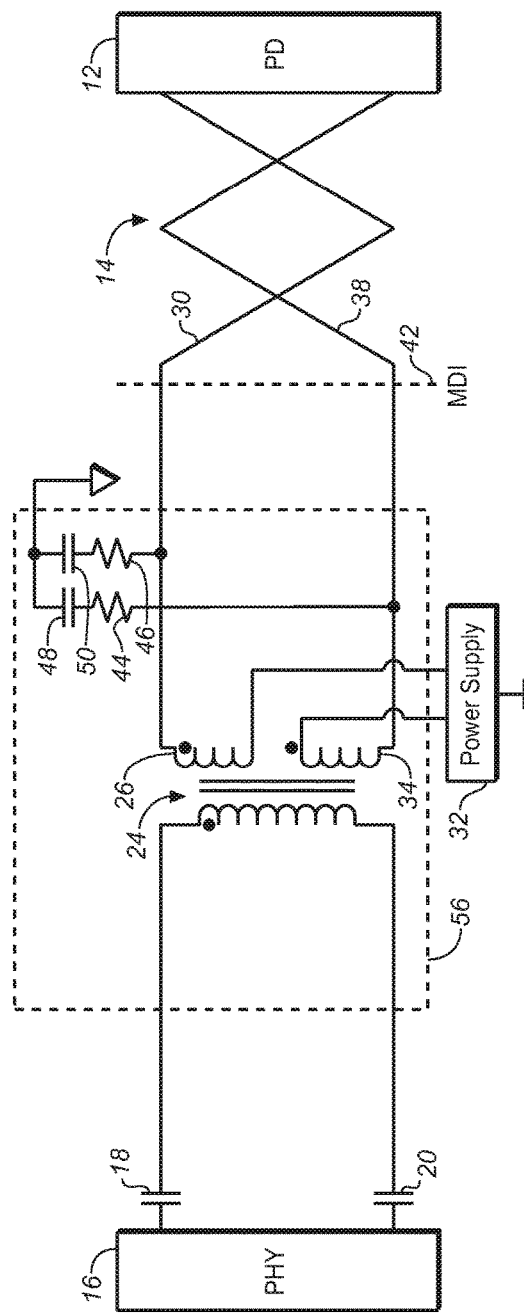
FIG. 4 is a second variation of FIG. 2 where the CMC has been removed due to sufficient common mode (CM) noise attenuation provided by the transformer. However, now the CM impedance is greatly reduced due to the low impedance path through the power supply.

FIG. 4 is similar to FIG. 2 except that the CMC 40 is deleted since the transformer 24 may adequately attenuate common mode RF noise. All the termination components in box 56 may be integrated. The common mode termination components may no longer be relevant since the common mode impedance of the transformer 24 is very low.

Figure 5:
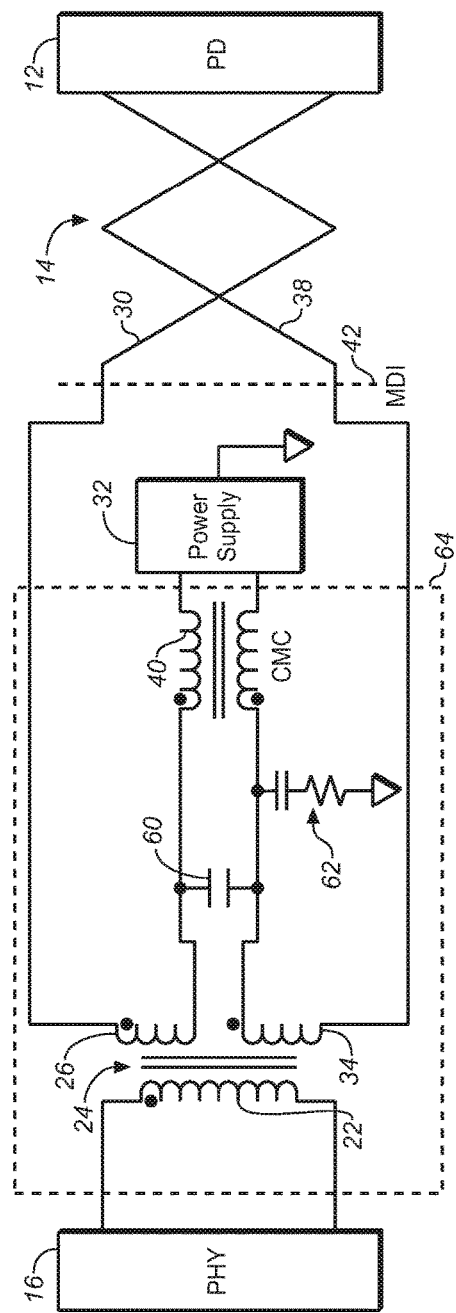
FIG. 5 is a third variation of FIG. 2 with the RC CM termination scheme modified. Also, a CMC is added in-between the power supply and secondary windings of the transformer in order to preserve the CM terminations.

In FIG. 5, the CMC 40 is added between the two secondary terminals 26 and 34 and the power supply terminals, and a capacitor 60 is added between the two secondary windings 26/34 in order to preserve the low differential mode impedance. The termination resistors and capacitors are now merged into one RC termination 62 and connected to one of the secondary windings 34. The CMC 40 in the path of the power supply 32 provides a high common mode impedance and preserves the effect of the common mode termination. In an alternative embodiment, the CMC 40 can be replaced by two discrete inductors. The components in the box 64 can be integrated into an MDI connector as with previous cases. Also, the AC coupling capacitors between the PHY and primary have been removed in this embodiment since the transformer 24 adequately blocks DC voltage from the PHY 16.

Figure 6:
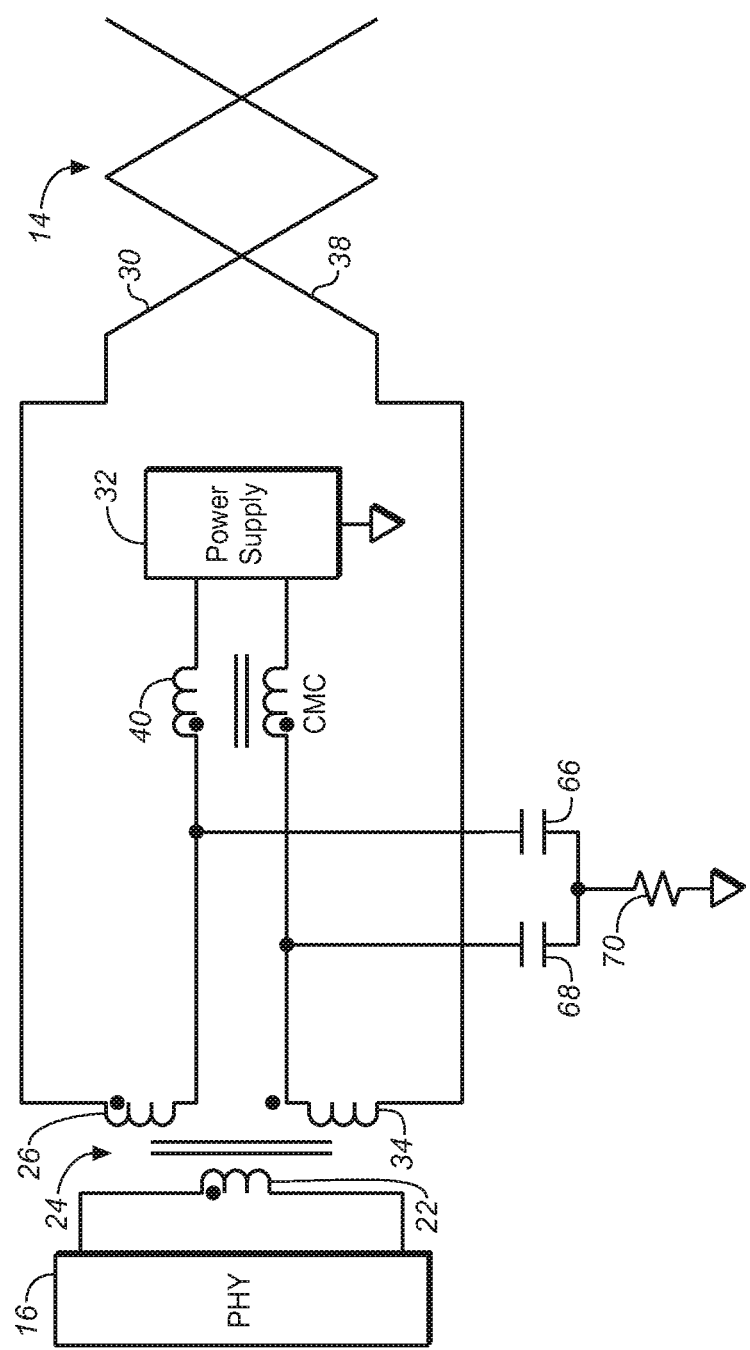
FIG. 6 is a fourth variation of FIG. 2 with an improved CM termination scheme.

FIG. 6 is similar to FIG. 5 except for the RC termination. In FIG. 5, there is a chance that a common mode signal passes through a different impedance on each path. This will introduce a differential mode signal (mode conversion) resulting in imbalance between the two lines. FIG. 6 uses a capacitive divider, comprising capacitors 66 and 68 coupled to the secondary windings 26 and 34, in series with a resistor 70 coupled to ground (or other reference voltage). This balanced configuration prevents mode conversion. The RC termination circuit of FIG. 6 may be used with any of the other configuration described herein instead of the RC terminations shown in FIGS. 2-5.

Figure 7:
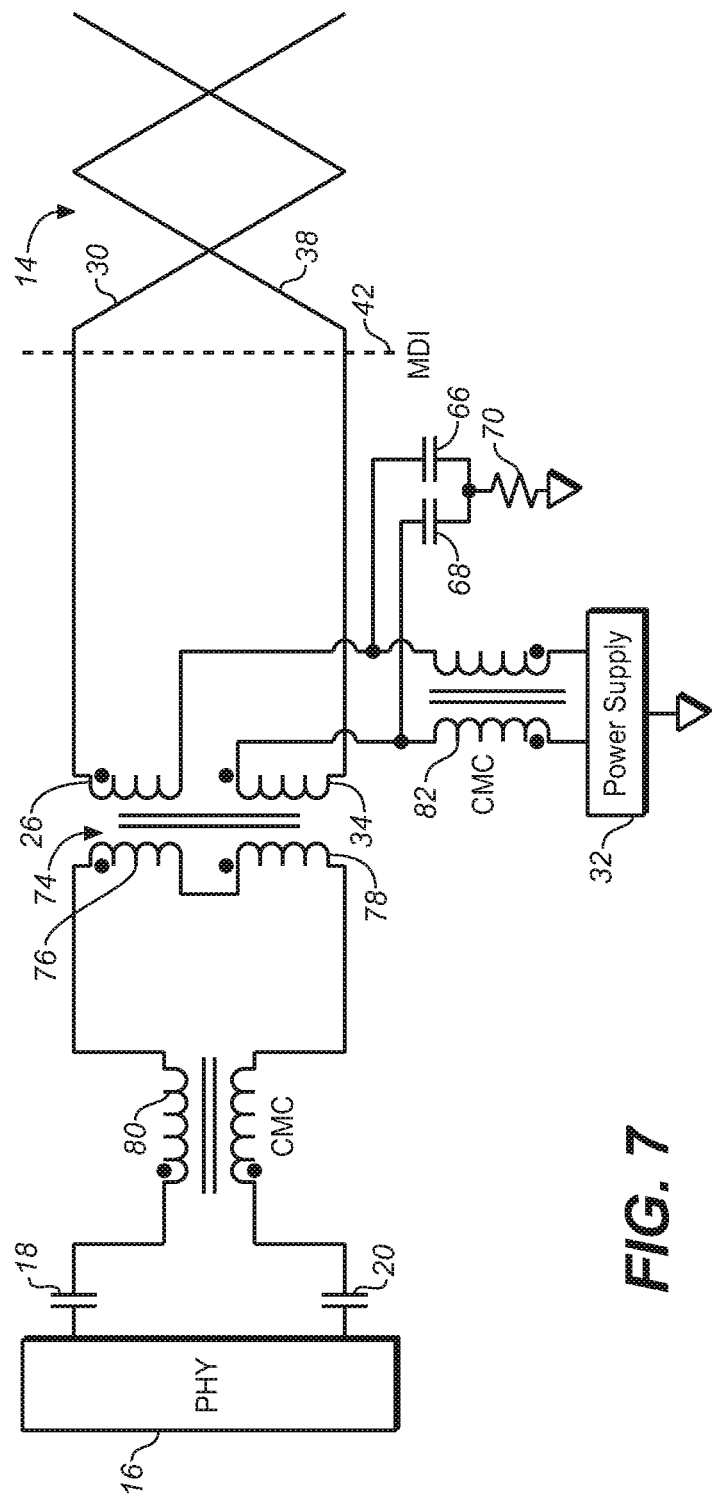
FIG. 7 illustrates a variation of the PSE using a split primary winding and using CMCs coupled to both the split primary winding and the split secondary winding. One CMC helps with CM noise reduction, while the other helps preserve the CM terminations.

FIG. 7 illustrates a variation of the PSE using a split primary winding and using CMCs coupled to both the split primary winding and the split secondary winding. One CMC helps with CM noise reduction, while the other helps preserve the CM terminations. Elements that are common to the elements in FIGS. 1-6 are similarly labeled and perform a similar function.

FIG. 7 shows a termination similar to that of FIG. 6 on the secondary side of the isolation transformer 74, but where the primary winding of the transformer 74 is split, resulting in primary windings 76 and 78.

First ends of the primary windings 76 and 78 are coupled to generate or receive differential data signals for/from the PHY 16. A CMC 80 is coupled in series between the primary windings 76 and 78 and the PHY 16. The CMC 80 attenuates common mode noise. Second ends of the primary windings 76 and 78 are shorted together to form a common reference.

Capacitors 18 and 20 AC-couple the PHY 16 to the CMC 80 for blocking DC.

A separate CMC 82 conducts DC power from the power supply 32 to the split secondary windings 26 and 34 in order to power a PD coupled to the wire pair 14. This CMC 82 provides a high common mode impedance and preserves the effect of the common mode termination. The primary center tap can also be coupled to a reference voltage, such as ground or a non-ground voltage.

Another magnetic device, such as a pair of separate inductors, may be used instead of the CMC 82 to conduct the DC power to the secondary windings.

The secondary windings 26 and 34 are terminated by capacitors 66 and 68 and resistor 70.

By using both a split primary winding and a split secondary winding, there is symmetry and possible ease of winding in the transformer, as well as the ability to use the split in the primary windings for various termination schemes. The two primary windings can also be coupled together and to a reference in various schemes. This offers several benefits such as additional DC-isolation of the PHY and reduced CM reflections, amongst others.

Figure 8:
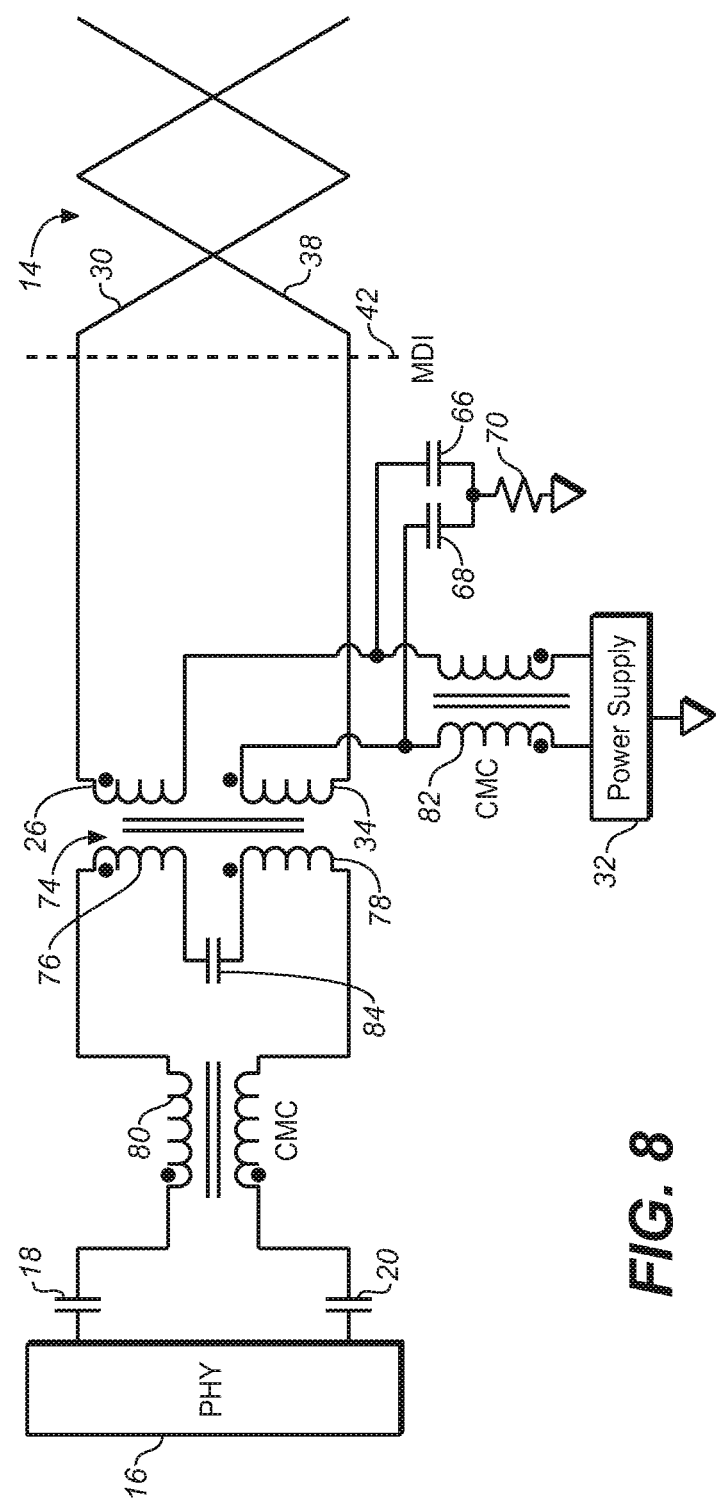
FIG. 8 illustrates a first variation of FIG. 7, where a capacitor is connected in series between the primary windings.

FIG. 8 illustrates a first variation of the PSE of FIG. 7, where the second ends of the primary windings 76 and 78 are connected to a single capacitor 84.

Figure 9:
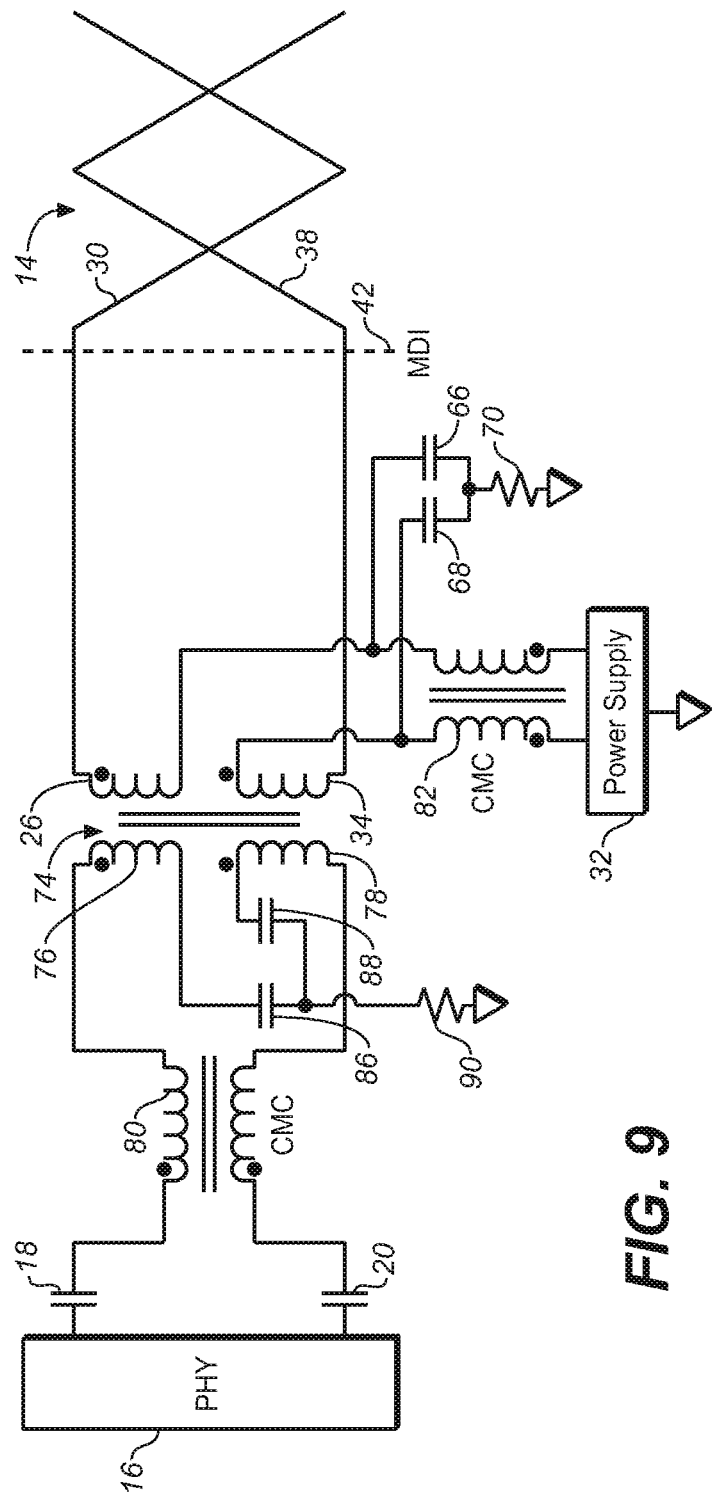
FIG. 9 illustrates a second variation of FIG. 7, where a capacitor is connected to each primary winding and coupled to ground via a resistor.

FIG. 9 illustrates a second variation of the PSE of FIG. 7, where the second ends of the primary windings 76 and 78 are terminated by capacitors 86 and 88 coupled to ground via the resistor 90.

Figure 10:
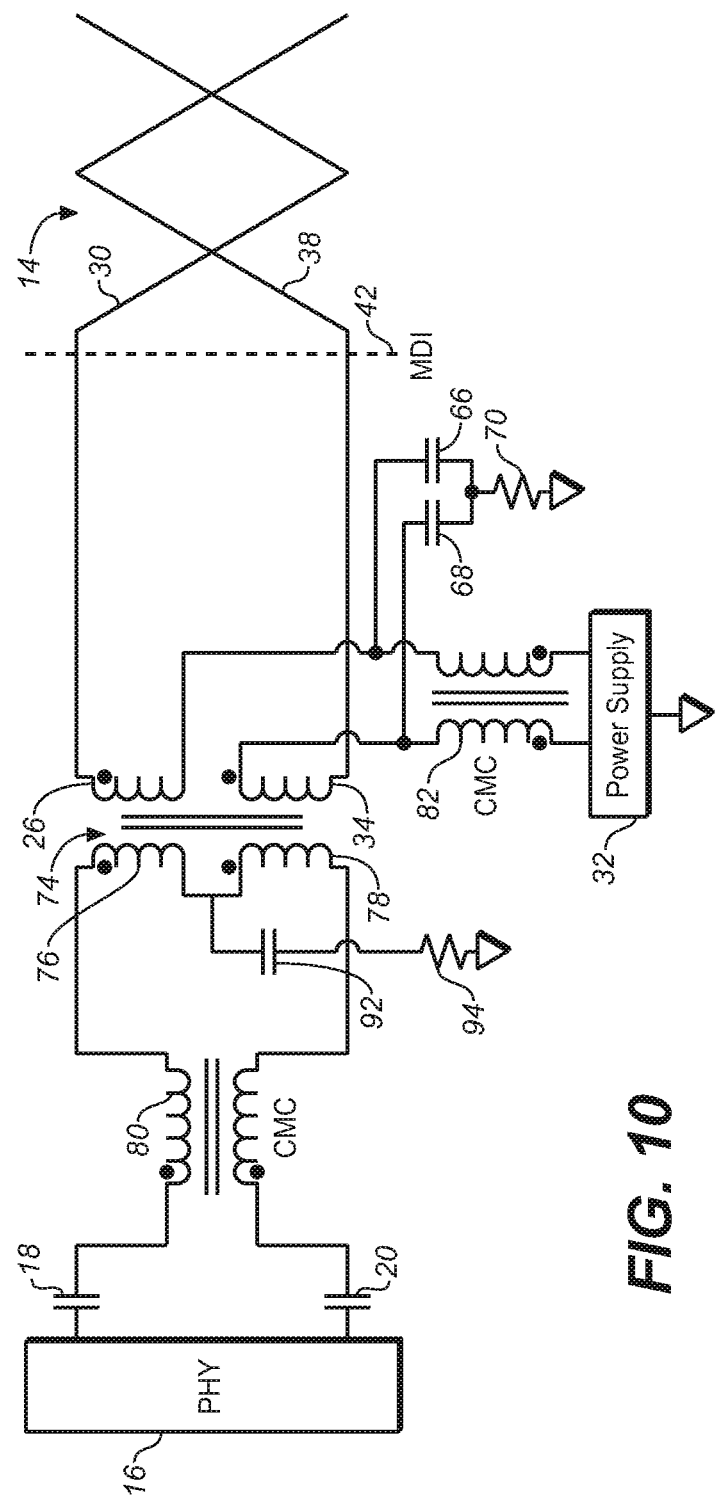
FIG. 10 illustrates a third variation of FIG. 7, where a single capacitor is connected to the primary windings and coupled to ground via a resistor.

FIG. 10 illustrates a third variation of the PSE of FIG. 7, where the second ends of the primary windings 76 and 78 are shorted together and terminated by the capacitor 92 coupled to ground via the resistor 94.

Figure 11:
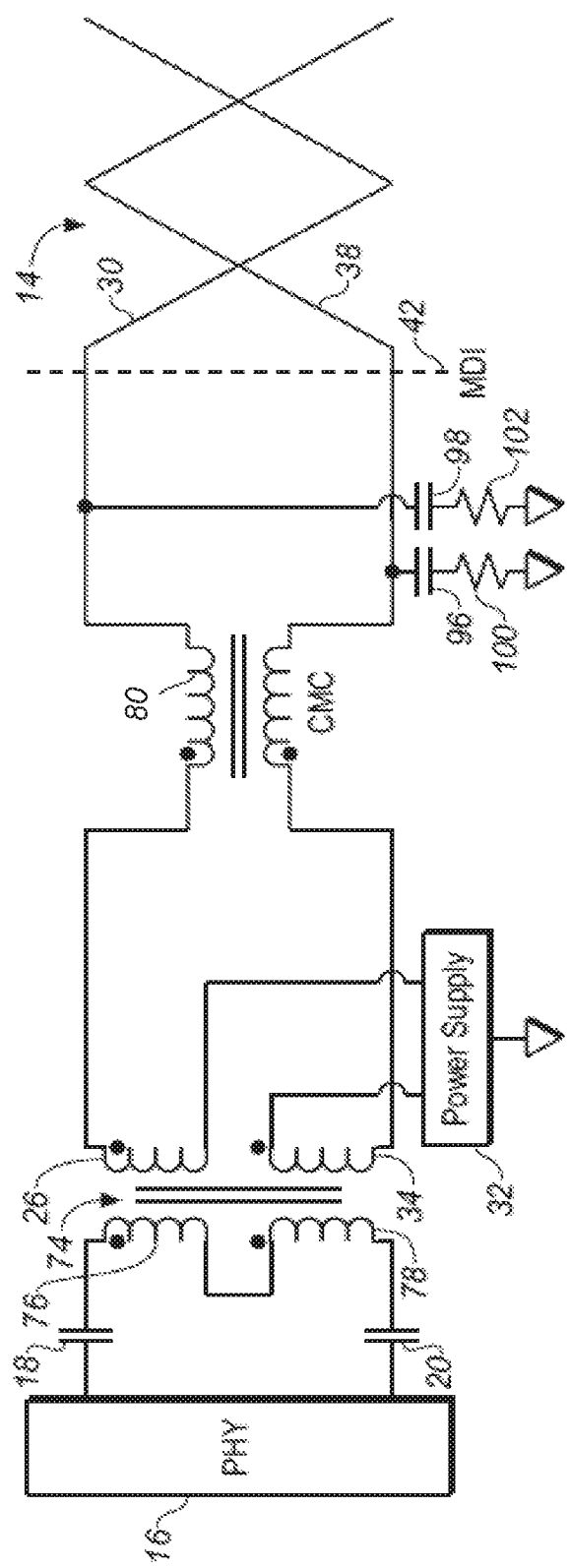
FIG. 11 illustrates a fourth variation of FIG. 7, where there is no CMC coupled in series between the transformer and the PHY or power supply.

FIG. 11 illustrates a fourth variation of the PSE of FIG. 7, where there is no CMC coupled between the transformer 74 and the PHY 16 or between the transformer 74 and the power supply 32. A CMC 80 is coupled between the secondary windings 26 and 34 and the wires 30 and 38. The wires 26 and 34 are terminated by capacitors 96 and 98 coupled to ground via resistors 100 and 102.

Figure 12:
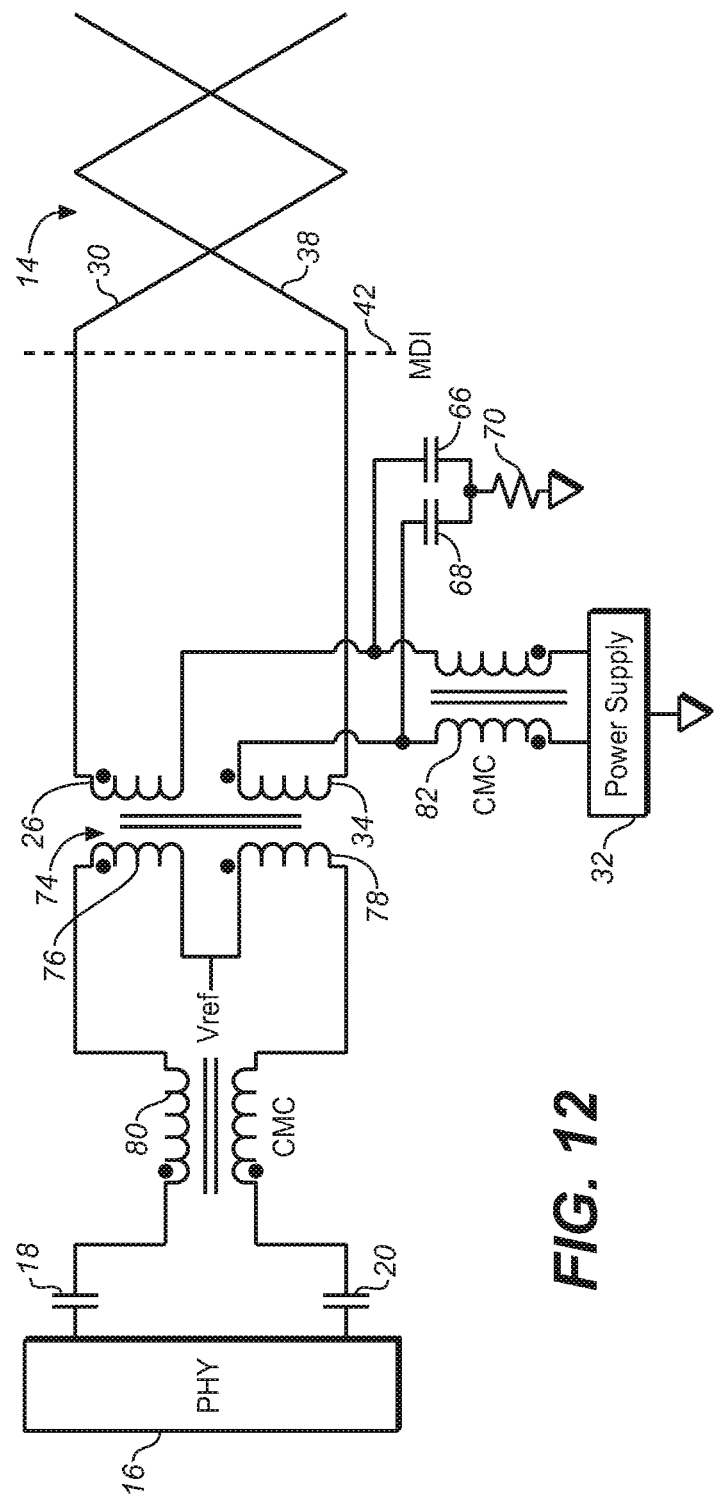
FIG. 12 illustrates a fifth variation of FIG. 7 in which the ends of the primary windings are coupled to either a ground or a non-ground reference voltage.

FIG. 12 illustrates a fifth variation of the PSE of FIG. 7, where the ends of the primary windings 76 and 78 are connected to a reference voltage Vref, which may be a non-ground or a ground voltage.

In a variation of FIG. 12, the ends of the primary windings 76 and 78 are connected to different fixed DC voltages.

The transformer with the split primary winding and split secondary winding may be used in any of the other embodiments described herein.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A power and communication system for providing differential data and DC power on a wire pair comprising:
   a DC power supply having a positive voltage terminal and a negative voltage terminal;
   an isolation transformer having at least four windings, including a first winding, a second winding, a third winding, and a fourth winding;
   wherein the positive voltage terminal of the power supply is coupled to a first end of the third winding, and wherein the negative voltage terminal of the power supply is coupled to a first end of the fourth winding; and
   a transceiver coupled to a first end of the first winding and a first end of the second winding for transmitting and receiving differential data signals via the transformer and the wire pair,
   wherein a second end of the third winding is configured to be coupled to a first wire of the wire pair, and a second end of the fourth winding is configured to be coupled to a second wire of the wire pair, such that the third winding and the fourth winding conduct DC power to the wire pair and also conduct differential data signals.

2. The system of claim 1 further comprising a first common mode choke (CMC) or a pair of matched inductors in series between the power supply terminals and the third and fourth windings of the transformer.

3. The system of claim 1 where the second ends of the first winding and the second winding are shorted together.

4. The system of claim 1 where the second ends of the first winding and the second winding are both connected to a DC voltage.

5. The system of claim 1 where the second ends of the first winding and the second windings are connected to different DC voltages.

6. The system of claim 1 where a capacitor couples the second ends of the first winding and the second winding together.

7. The system of claim 1 wherein second ends of the first winding and the second winding are coupled together and to a capacitor in series with a resistor connected to ground.

8. The system of claim 1 wherein second ends of the first winding and the second winding are coupled to respective capacitors, and wherein the capacitors are coupled to ground via a resistor.

9. The system of claim 1 wherein second ends of the first winding and the second winding are coupled to a reference voltage.

10. The system of claim 1 further comprising:
    an RC termination circuit coupled between the power supply and the transformer, the RC termination circuit comprising:
    a resistor having a first end coupled to ground;
    a first capacitor coupled between the first end of the third winding and a second end of the resistor; and
    a second capacitor coupled between the first end of the fourth winding and the second end of the resistor.

11. The system of claim 1 wherein the transceiver is coupled to the first end of the first winding via a first capacitor and coupled to the first end of the second winding via a second capacitor.

12. The system of claim 1 further comprising a common mode choke (CMC) in series between the first ends of the first winding and the second winding and the transceiver.

13. The system of claim 1 further comprising a common mode choke (CMC) coupled between the second ends of the third and fourth windings and the wire pair.

14. The system of claim 1 wherein the power supply has a low impedance between the positive voltage terminal and the negative voltage terminal.

15. The system of claim 1 further comprising a powered device coupled to the wire pair for receiving the DC power from the power supply and the differential data signals from the transceiver.

16. The system of claim 1 wherein the transformer attenuates common mode noise.

17. The system of claim 1 further comprising a capacitor coupled across the first ends of the third winding and fourth winding.

18. The system of claim 1 wherein the transceiver comprises a PHY.

19. The system of claim 14 wherein the negative voltage terminal is coupled to ground.

20. The system of claim 17 further comprising:
    an RC termination network coupled to one of the terminals of the capacitor; and a CMC or a pair of inductors coupled between the first ends of the third and fourth windings and the positive and negative terminals of the power supply.

\* \* \* \* \*